US010063241B2

(12) United States Patent
Ma

(10) Patent No.: US 10,063,241 B2
(45) Date of Patent: *Aug. 28, 2018

(54) DIE LOCATION COMPENSATION

(71) Applicant: Micron Technology, Inc., Boise, ID (US)

(72) Inventor: Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/843,676

(22) Filed: Sep. 2, 2015

(65) Prior Publication Data

US 2015/0381189 A1    Dec. 31, 2015

Related U.S. Application Data

(63) Continuation of application No. 12/548,883, filed on Aug. 27, 2009, now Pat. No. 9,160,349.

(51) Int. Cl.
*H03L 7/06* (2006.01)
*H03L 7/081* (2006.01)
(Continued)

(52) U.S. Cl.
CPC ............ *H03L 7/0812* (2013.01); *G11C 5/02* (2013.01); *G11C 7/222* (2013.01); *G11C 29/023* (2013.01); *G11C 29/025* (2013.01); *G11C 29/028* (2013.01); *H03L 7/0814* (2013.01); *H03L 7/0816* (2013.01); *H01L 2224/14181* (2013.01); *H01L 2224/16145* (2013.01); *H01L 2224/16225* (2013.01); *H01L 2224/48227* (2013.01); *H01L 2224/73207* (2013.01); *H01L 2924/15311* (2013.01); *H01L 2924/3011* (2013.01)

(58) Field of Classification Search
CPC .... G06F 1/10; G06F 1/04; G06F 1/08; H03K 5/135; G11C 7/22
USPC .......................... 327/158, 161, 291–298, 565
See application file for complete search history.

(56) References Cited

U.S. PATENT DOCUMENTS 5,122,679 A    6/1992  Cho
5,361,277 A *  11/1994  Grover .................. H03K 5/135
                                                    327/141

(Continued)

OTHER PUBLICATIONS

International Search Report and Written Opinion for International Application No. PCT/US10/044123 dated Feb. 25, 2011, 13 pages.

(Continued)

*Primary Examiner* — Quan Tra
(74) *Attorney, Agent, or Firm* — Dorsey & Whitney LLP

(57) ABSTRACT

Embodiments are described that compensate for a difference in a characteristic (e.g., of performance or operation) of a semiconductor device that is a function of the location of a die in a device. In one embodiment, a clock circuit may generate a clock signal having a timing that varies with the location of a die so that signals are coupled from the die to a substrate at the same time despite differences in the signal propagation time between the substrate and the various die. In other embodiments, for example, differences in the termination impedance or driver drive-strength resulting from differences in the location of a die in a stack may be compensated for. Other embodiments are also disclosed.

18 Claims, 6 Drawing Sheets

(51) Int. Cl.
*G11C 7/22* (2006.01)
*G11C 29/02* (2006.01)
*G11C 5/02* (2006.01)

(56) References Cited

U.S. PATENT DOCUMENTS

| | | | |
|---|---|---|---|
| 5,442,776 A * | 8/1995 | Masleid et al. | 713/503 |
| 5,565,816 A | 10/1996 | Coteus | |
| 5,570,054 A | 10/1996 | Takla | |
| 5,670,903 A | 9/1997 | Mizuno | |
| 5,696,951 A * | 12/1997 | Miller | 713/503 |
| 5,751,665 A | 5/1998 | Tanoi | |
| 5,852,640 A | 12/1998 | Kliza et al. | |
| 5,867,448 A * | 2/1999 | Mann | 365/233.14 |
| 5,949,262 A | 9/1999 | Dreps et al. | |
| 6,124,744 A * | 9/2000 | Oowaki | 327/262 |
| 6,150,866 A * | 11/2000 | Eto et al. | 327/297 |
| 6,191,632 B1 * | 2/2001 | Iwata | G06F 1/10 327/262 |
| 6,266,265 B1 * | 7/2001 | Sakuragi | 365/63 |
| 6,323,714 B1 | 11/2001 | Naffzinger et al. | |
| 6,448,661 B1 | 9/2002 | Kim et al. | |
| 6,605,969 B2 | 8/2003 | Mikhalev et al. | |
| 6,744,287 B2 | 6/2004 | Mooney et al. | |
| 6,791,175 B2 | 9/2004 | Matsuo et al. | |
| 6,985,401 B2 * | 1/2006 | Jang | G11C 7/22 365/194 |
| 6,991,964 B2 | 1/2006 | Matsuo et al. | |
| 6,996,026 B2 | 2/2006 | Brox et al. | |
| 7,015,741 B2 | 3/2006 | Gold | |
| 7,161,400 B2 | 1/2007 | Nguyen et al. | |
| 7,667,510 B2 * | 2/2010 | Shim | G11C 7/22 327/149 |
| 7,726,197 B2 | 6/2010 | Selvan | |
| 7,971,088 B2 | 6/2011 | Jung et al. | |
| 2002/0097074 A1 * | 7/2002 | Kim | G11C 7/1051 327/158 |
| 2003/0137335 A1 | 2/2003 | Hofstra | |
| 2003/0071669 A1 | 4/2003 | Liu et al. | |
| 2003/0179028 A1 * | 9/2003 | Kizer et al. | 327/158 |
| 2004/0041604 A1 | 3/2004 | Kizer et al. | |
| 2005/0051903 A1 | 3/2005 | Ellsberry et al. | |
| 2005/0231247 A1 | 10/2005 | Cho | |
| 2005/0254318 A1 | 11/2005 | Jang et al. | |
| 2006/0267212 A1 | 11/2006 | Shibata et al. | |
| 2008/0043548 A1 | 2/2008 | Jung et al. | |
| 2008/0204091 A1 | 8/2008 | Choo et al. | |
| 2008/0258700 A1 | 10/2008 | Block et al. | |
| 2009/0154285 A1 | 6/2009 | Pyeon | |
| 2009/0323456 A1 * | 12/2009 | Gomm | 365/233.1 |
| 2011/0050303 A1 | 3/2011 | Ma | |

OTHER PUBLICATIONS

Taiwanese Office Action dated May 13, 2014 for Appln No. 099128113.
Ryu, et al. "A Three-Dimensional Stacked-Chip Star-Wiring Interconnection for a Digital Noise-Free and Low-Jitter I/O Clock Distribution Network", IEEE, vol. 16, No. 12, Dec. 2006, 651, 653.
Wang et al., "An Ultra-Low-Power Fast-Lock-in Small-Jitter All-Digital DLL", IEEE International vol. 1 10-10, Feb. 2005, 28, 422, 607.
Chung et al., "Chip-Package Hybrid Clock Distribution Network and DDL for Low Jitter Clock Delivery", IEEE Journal, vol. 41 No. 1, Jan. 2006, 274, 286.
Extended Search Report for Appl No. 10814131.8 dated Jul. 31, 2013.
Office Action for Appl No. CN201080037704.6, dated Nov. 3, 2014.
Office Action for Appl No. CN201080037704.6, dated Dec. 25, 2013.
Notice of Preliminary Rejection for KR Appl No. 10-2012-7006055, dated Dec. 12, 2013.
Korean Notice of Preliminary Rejection for Korean Patent Application No. 10-2012-7006055 dated Apr. 9, 2013.
European Examination Report dated Mar. 2, 2018 for European Application No. 10814131.8.

* cited by examiner

DIE LOCATION COMPENSATION

CROSS-REFERENCE TO RELATED APPLICATION(S)

This application is a continuation of pending U.S. patent application Ser. No. 12/548,883 filed Aug. 27, 2009, issued as U. S. Pat. No. 9,160,349 on Oct. 13, 2015. The aforementioned application and patent are herein incorporated by reference, in their entirety, for any purpose.

TECHNICAL FIELD

Embodiments of this invention relate to devices that have a plurality of semiconductor die, and more particularly, in one or more embodiments, to stacked integrated circuit die and clock signals.

BACKGROUND

Periodic signals are used in a variety of electronic devices. One type of periodic signal is a clock signal that can be used to establish the timing of a signal or the timing at which an operation is performed on a signal. For example, data signals are typically coupled to and from memory devices, such as synchronous dynamic random access memory ("SDRAM") devices, in synchronism with a clock signal or data strobe signal. More specifically, read data signals are typically coupled from a memory device in synchronism with either a clock signal or a read data strobe signal that may be synchronous with a clock signal. The read data strobe signal is normally generated by the same memory device that is outputting the read data signals. Write data signals are typically latched into a memory device in synchronism with a clock signal or a write data strobe signal that may also be synchronous with a clock signal. Other signals generated in electronic devices, such as memory devices or memory controllers, are often synchronized or triggered by an internal clock signal. For example a clock signal may be used in a memory device for latching write data and/or outputting read data. The clock signal is typically generated in the memory device from an internal clock signal using a delay-lock loop.

One of the advantages of using a delay lock loop to generate an internal clock signal in an integrated circuit is that various delays in an integrated circuit can be modeled by delay model circuits and used in the feedback path of a delay lock loop to compensate for such delays. For example, the delay in coupling a clock signal through a clock tree to a read data latch can be modeled by a model delay in the feedback path of a delay lock loop that generates the clock signal. As a result, read data may be latched and thus output from the memory device substantially in synchronism with a clock signal despite a propagation delay of a clock signal through the clock tree.

While various techniques such as a delay lock loop containing a model delay may alleviate to some extent problems resulting from propagation delays in integrated circuits, the problems of signal propagation delays may become more severe in a semiconductor device using multiple semiconductor die, such as where the multiple die are stacked. More specifically, even if propagation delays can be compensated for in each die, there may still be propagation delays in coupling signals between each die and external electrical connectors (e.g., terminals) of the integrated circuit device. With reference to FIG. 1, a semiconductor device 10 may include 4 semiconductor die 12, 14, 16, and 18, some of which may be identical to each other or different from each other. The die 12-18 may be mounted on a surface 20 of a substrate 24, and external terminals in the form of a ball grid array 28 may be mounted on an opposed surface 30 of the substrate 24. One of the balls 32 of the ball grid array 28 may receive a clock signal ("CLK"), and a plurality of other balls 34 (only one is shown) may receive and transmit data signals. Individual balls of the array ball grid array 28 may be coupled to the die 12-18 through respective internal balls 38 positioned against each surface of the die 12-18 between adjacent die or between the die 12 and the substrate 24. Signals may be coupled from one surface of the die 12-18 to an opposite surface by internal electrical connectors such as through silicon vias ("tsv") 40.

FIG. 2 shows a semiconductor device 52 that also includes the stacked die 12-18. The semiconductor device 52 may be substantially similar to the semiconductor device 10 of FIG. 1. Therefore, in the interest of brevity and clarity, identical reference numerals will be used to identify identical components. The device 52 differs from the device 10 by using bond wires 62, 64, 66, 68 as internal electrical connectors to couple all or some signals from the substrate 24 to the die 12-18. However, the device 52 may also use the internal balls 38 to couple signals between the die 12-18.

Regardless of whether the signal coupling technique shown in FIG. 1 or FIG. 2 is used or some other technique is used, the propagation delay in coupling signals between the external electrical connectors 28 and the die 12-18 may differ from die-to-die. For example, the CLK signal will be received by the die 12-18 with increasingly larger delays from the die 12 to the die 18. As a result, for example, read data may be output from the die 12-18 at increasing distances from the electrical connectors 28. Moreover, the propagation delay in coupling the read data from each of the die 12-18 to the electrical connectors 28 may increase from the die 12 to the die 18. Insofar as the read data from the devices 10, 50 may be latched by an external device in synchronism with the CLK signal or some other signal, the "data eye" during which the read data is valid may become increasingly later for die 12-18 farther away from the electrical connectors 28. More importantly, the overlap in the respective data eyes from the die 12-18 may set the overall data eye for the device 12-18 during which read data from the devices 10, 50 is valid regardless of which die originated the read data. The size of the data eye may therefore become smaller as the common data valid time overlaps in the respective data eyes from the die 12-18 become smaller. A smaller data eye may make it more difficult for an external device to correctly latch read data from the devices 10, 50. This skewed data eye problem gets worse when duty cycle distortion is present. Similar types of problems may exist for other types of signals, such as write data signals.

The problems resulting from differences in the connections between the electrical connectors 28 and each of the die 12-18 may also result in problems other than signal propagation problems, such as output slew rate skew, ZQ calibration termination impedance mismatch, etc. For example, the longer signal paths between the electrical connectors 28 and the die farther away from the electrical connectors 28 may increase the resistance between the electrical connectors 28 and the die 12-18 farther away from the electrical connectors. As a result, the "drive strength" of signal transmitters on the die 12-18 may become increasing less away from the electrical connectors 28. The increased resistance between the electrical connectors 28 and the die 12-18 farther away from the electrical connectors 28 may

DETAILED DESCRIPTION OF PREFERRED EMBODIMENTS

Figure 1:
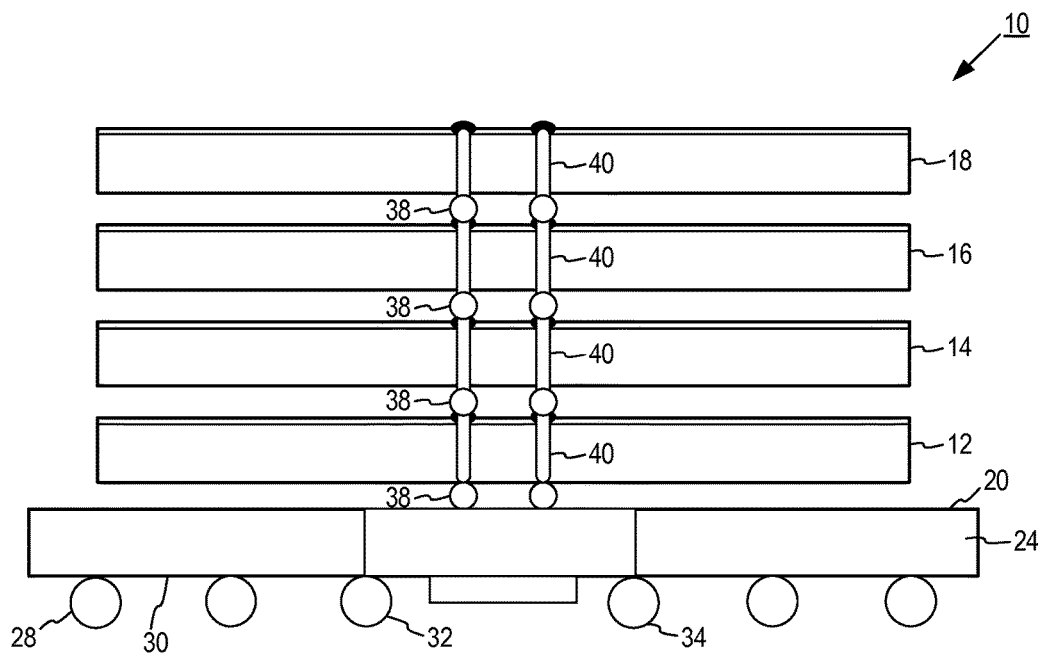
FIG. 1 is a schematic cross-sectional view of a semiconductor device using a plurality of stacked die.
Figure 2:
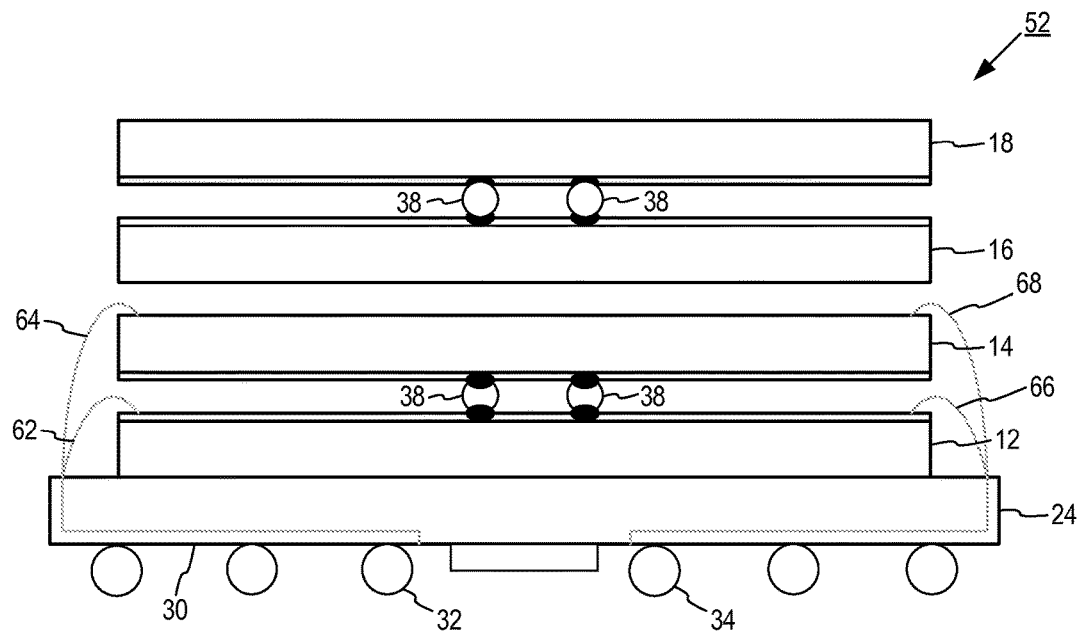
FIG. 2 is a schematic cross-sectional view of another semiconductor device using a plurality of stacked die.
Figure 3:
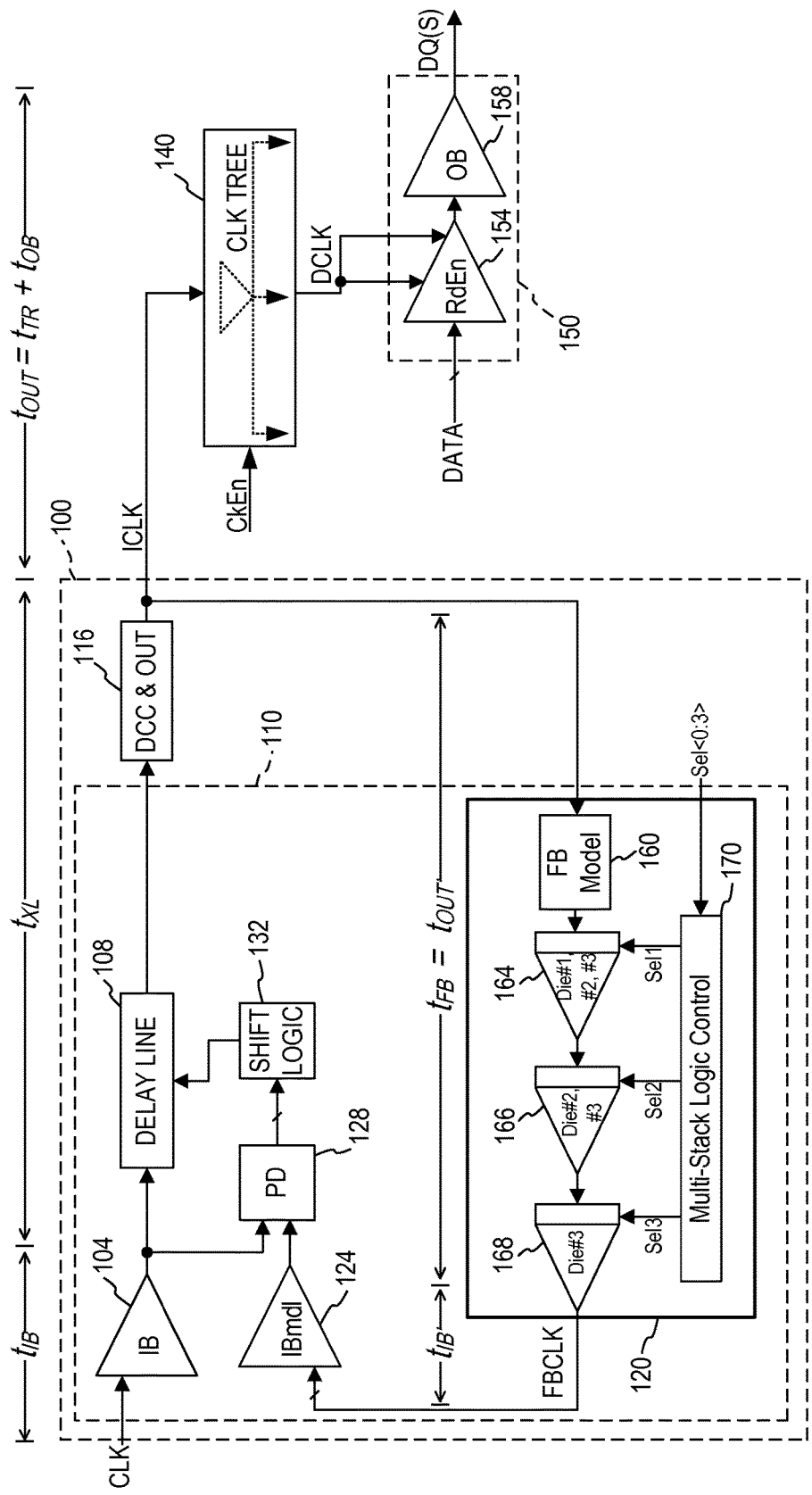
FIG. 3 is a schematic diagram showing an embodiment of a clock circuit that may provide an internal clock signal to a clock tree in a semiconductor die.

A locked-loop, such as a delay lock loop, may be used to compensate for disparate signal propagation delays between external electrical connectors (e.g., terminals, contacts, etc.), such as the ball grid array 28 (FIGS. 1 and 2), and a plurality of die. As shown in FIG. 3, a clock circuit 100 may use a delay lock loop ("DLL") 110 receiving an input clock ("CLK") signal to provide an internal clock signal ("ICLK") to a clock tree 140. When enabled by an active CkEn signal, the clock tree 140 may distribute the ICLK signal to a variety of circuits for a variety of uses. For example, as shown in FIG. 3, the ICLK signal may be used to provide a data clock ("DCLK") signal to an output buffer 150. The output buffer 150 may include a data register 154 that is clocked by the DCLK signal and/or its complementary signal to provide data signals ("Data") to an output buffer circuit 158 to output read data ("DQ") signals (only one is shown). As explained above with reference to FIGS. 1 and 2, the read DQ signals may be routed from each of the die 12-18 to the electrical connectors of a device, such as devices 10 and 52, including the clock circuit 100.

The clock circuit 100 may also include a duty cycle correction (DCC) circuit and output buffer 116 to ensure that the duty cycle of the ICLK signal is at substantially 50%. The ICLK signal may also be coupled though a feedback path, which may include a feedback FB Model Delay Unit 120. A feedback clock ("FBCLK") signal, which may be a delayed version of the ICLK signal, may be coupled through an input buffer ("IB") model delay 124 to an input of a phase detector 128. The phase detector 128 detects a phase difference between the signals applied to its input and outputs a phase error signal indicative of the phase difference between the input signals. This phase error signal may be provided to shift logic 132 that generates a control signal based on the phase error signal to adjust the delay of a DLL delay line 108 to which the CLK signal is applied. The delay of the delay line 108 may be increased or decreased in order to synchronize the inputs of the phase detector 128. When synchronized, the DLL 110 is said to be "locked."

The goal of the clock circuit 100 is to output the DQ signals to respective externally accessible terminals, such as respective balls of the ball grid array 28, in synchronism with a CLK signal applied to an externally accessible terminal, such a respective ball of the ball grid array 28. As mentioned above, when the DLL 110 is locked, the signals applied to the phase detector 128 will be synchronized with each other. However, the read data DQ may be output from the output buffer 150 after a delay equal to the sum of a propagation delay $t_{TR}$ through the clock tree 140 and a delay $t_{OB}$ through the output buffer circuit 150. The DQ signals may then be output but may be delayed by a propagation delay $t_O$ from one of the die 12-18 to the external terminals such as the ball grid array 28. Thus, the DQ signals may be output from the semiconductor device 10 after a delay of $t_{TR}+t_{OB}+t_O$ from the signal that the input buffer 104 applies to the delay line 108. The delay of the DQ signals being applied to the external terminals of the device 10 relative to the CLK signal applied to the external terminals may be further increased by the propagation delay $t_I$ of the CLK signal from the external terminals to the die 12-18 as well as the propagation delay $t_{IB}$ through the input buffer 104. The functions of the IB model delay 124 and the FB Model Delay Unit 120 are to compensate for these delays so the DQ signals at the external DQ terminals of the device are synchronized to the CLK signal at the external CLK terminal of the device, such as one of devices 10 or 52. The IB model delay 124 models the propagation delay of the input buffer 104 so that, if the signals applied to the inputs of the phase detector 128 are synchronized, the FBCLK signal will be synchronized to the CLK signal. The remaining delays discussed above are compensated for by the FB Model Delay Unit 120. Specifically, if the delay of the FB Model Delay is equal to $t_{TR}+t_{OB}+t_O+t_I$ and the FBCLK signal is synchronized to the CLK signal at the input of the buffer 104, the ICLK signal will lag the CLK signal by $t_{XL}=N*t_{CK}-(t_{TR}+t_{OB}+t_O+t_I)$, where N is the DLL total clock loop number. As a result, the DQ signals may be applied to the external terminals of the device in synchronism with the CLK signals applied to the external terminals of the device.

Unfortunately, while the propagation delay $t_{TR}$ of the clock tree 140 and the propagation delay $t_{OB}$ of the output buffer 150 may be substantially the same for all of the die 12-18, the propagation delay $t_I$ of the CLK signal from the external DQ terminals of the device and the propagation delay $t_O$ from the die 12-18 to the external DQ terminals of the device may be different for each location of the die 12-18. Specifically, the propagation delay of the CLK signal for the die 12 will be $t_{I\_0}$, the propagation delay for the die 14 will be $t_{I\_0}+t_{I\_1}$, the propagation delay for the die 16 will be $t_{I\_0}+t_{I\_1}+t_{I\_2}$, and the propagation delay for the die 18 will be $t_{I\_0}+t_{I\_1}+t_{I\_2}+t_{I\_3}$. The propagation delay of the DQ signals for the die 12 will be $t_{O\_0}$, the propagation delay for the die 14 will be $t_{O\_0}+t_{O\_1}$, the propagation delay for the die 16 will be $t_{O\_0}+t_{O\_1}+t_{O\_2}$, and the propagation delay for the die 18 will be $t_{O\_0}+t_{O\_1}+t_{O\_2}+t_{O\_3}$. The FB Model Delay Unit 120 may compensate for all of these differences in propagation delays by including a FB Model circuit 160 and a plurality of switchable delays 164, 166, 168 that may be selectively enabled. When enabled, the switchable delay 164 may provide a delay of $t_{I\_1}+_{O\_1}$, the switchable delay 166 may provide a delay of $t_{I\_2}+_{O\_2}$, and the switchable delay 168 may provide a delay of $t_{I\_3}+_{O\_3}$. The switchable delays 164-168 may be enabled by respective select signals Sel 1-Sel 3 from a Multi-Stack Logic Control circuit 170, which, in turn, may receive a 4-bit Sel<0:3> signal. Examples of techniques for generating the Sel<0:3> signal will be provided below, it being understood that other techniques may also be used.

The delay of the FB Model circuit 160 may, for example, be equal to the sum of the propagation delay $t_{I\_0}$ of the CLK signal from an external terminal of the device 10, 52 to the die 12, the propagation delay $t_{O\_0}$ of the DQ signals from the die 12 to an external terminal of the device, the delay $t_{TR}$ of the clock tree 140, and the delay $t_{OB}$ of the output buffer 150.

In operation, the Sel<0:3> signal may identify the location of the die 12-18 relative to the external electrical connector(s) of the device, such as one of devices 10, 52. For Example, the Sel<0:3> signal may be decoded as shown in Table A below.

TABLE A

| STACK POSITION | Sel<0:3> | Sel1 | Sel2 | Sel3 |
|---|---|---|---|---|
| 0 | 000 | 0 | 0 | 0 |
| 1 | 100 | 1 | 0 | 0 |
| 2 | 010 | 1 | 1 | 0 |
| 3 | 001 | 1 | 1 | 1 |

As shown in Table A, none of the switchable delays are enabled for the die 12 in stack position 0, only the switchable delay 164 is enabled for the die 14 in stack position 1, both switchable delays 164 and 166 are enabled for the die 16 in stack position 2, and all of the switchable delays 164-168 are enabled for the die 18 in stack position 3. As a result, the delays provided by the FB Model Delay Unit 120 are as shown in Table B, below.

TABLE B

| DIE | DELAY |
|---|---|
| 12 | $t_{TR} + t_{OB} + t_{I\_0} + t_{O\_0}$ |
| 14 | $t_{TR} + t_{OB} + t_{I\_0} + t_{I\_1} + t_{O\_0} + t_{O\_1}$ |
| 16 | $t_{TR} + t_{OB} + t_{I\_0} + t_{I\_1} + t_{I\_2} + t_{O\_0} + t_{O\_1} + t_{O\_2}$ |
| 18 | $t_{TR} + t_{OB} + t_{I\_0} + t_{I\_1} + t_{I\_2} + t_{I\_3} \cdot + t_{O\_0} + t_{O\_1} + t_{O\_2} + t_{O\_3}$ |

The variable delay of the FB Model Delay Unit 120 may therefore allow the DQ signals to be output from external terminals of the device, such as respective balls of the ball grid array 28, in synchronism with the CLK signal being applied to an external terminal of the device, such as one of the balls of the ball grid array 28.

In the embodiment of the clock circuit 100 shown in FIG. 3, the switchable delays 14-18 are coupled in series with each other, and their delays may be substantially equal to each other since the delay from one die 12-18 to the next may be substantially equal. In another embodiment, the switchable delays 14-18 coupled in series with each other may provide increasingly larger delays when they are enabled. In such an embodiment, if the switchable delays were not enabled, they would provide substantially no delay. Therefore, the delay of a first switchable delay may be $t_{I\_1}+t_{O\_1}$, the delay of a second switchable delay may be $t_{I\_1}+t_{O\_1}+t_{I\_2}+t_{O\_2}$, and the delay of a third switchable delay may be $t_{I\_1}+t_{O\_1}+t_{I\_2}+t_{O\_2}+t_{I\_3}+t_{O\_3}$. For this embodiment, the Sel<0:3> signal could be decoded as shown in Table C, below.

TABLE C

| STACK POSITION | Sel<0:3> | Sel1 | Sel2 | Sel3 |
|---|---|---|---|---|
| 0 | 000 | 0 | 0 | 0 |
| 1 | 100 | 1 | 0 | 0 |
| 2 | 010 | 0 | 1 | 0 |
| 3 | 001 | 0 | 0 | 1 |

The resulting delays provided by the FB Model Delay would therefore be the same as shown in Table B.

Figure 4:
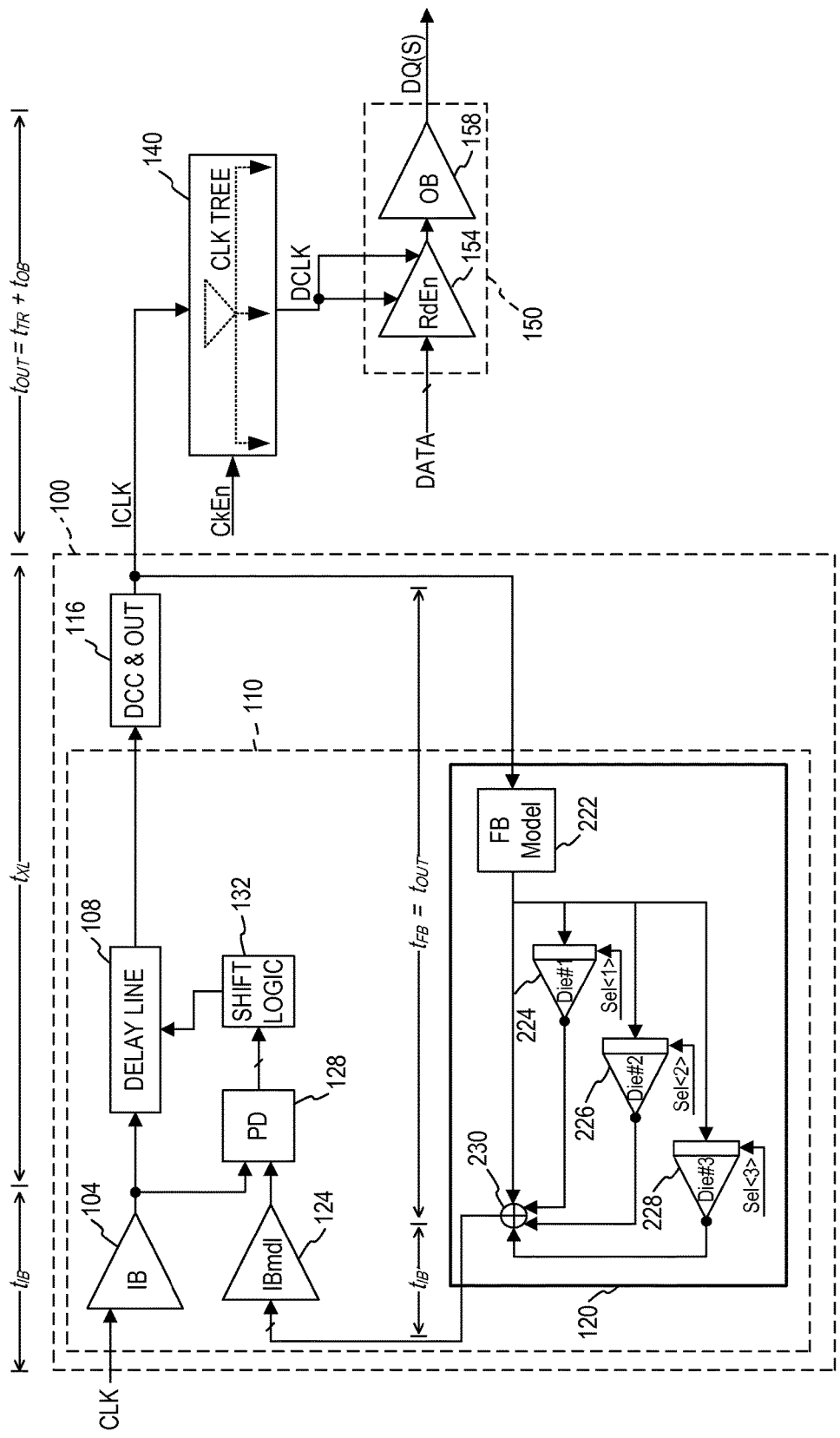
FIG. 4 is a schematic diagram showing another embodiment of a clock circuit that may provide an internal clock signal to a clock tree in a semiconductor die.

Although the previously described embodiments of the FB Model Delay Unit 120 use switchable delays that may be coupled in series with each other, in another embodiment of a clock circuit 200 shown in FIG. 4 the FB Model Delay Unit 120 may use switchable delays coupled to each other in parallel. The clock circuit 200 uses many of the same components that are used in the clock circuit 100 of FIG. 3. Therefore, in the interests of brevity and clarity, corresponding components have been provided with the same references numerals, and descriptions of their functions and operation will not be repeated. The clock circuit 200 differs from the clock circuit 100 by including a the FB Model Delay Unit 220 that uses switchable delays 224, 226, 228 that may be coupled in parallel with each other between the output of a FB Model 222 and a 4-input multiplexer 230. The multiplexer 230 may have a 4-bit control input that receives the Sel<0:3> signal to select the output from either one of the FB Model 160 or one of the switchable delays 224, 226, 228. The delays of the switchable delays may be the same delays as the switchable delays used in the series coupled switchable delays having increasingly larger delays as explained above. Specifically, the delay of a first switchable delay 224 may be $t_{I\_1}+t_{O\_1}$, the delay of a second switchable delay 226 may be $t_{I\_1}+t_{O\_1}+t_{I\_2}+t_{O\_2}$, and the delay of a third switchable delay 228 may be $t_{I\_1}+t_{O\_1}+t_{I\_2}+t_{O\_2}+t_{I\_3}+t_{O\_3}$.

The FB Model 222 may also provide the same delay as the FB Model 160 used in the clock circuit 100 except that the FB Model 160 may provide an additional delay $T_{MUX}$ corresponding to the propagation delay through the multiplexer 230. The resulting delays provided by the FB Model Delay Unit 220 would therefore be the same as the delays provided by the FB Model Delay Unit 120 except for the additional delay $T_{MUX}$.

Although the foregoing describes specific embodiments of locked-loops in the form of delay-lock loops, other types of locked-loops, such as phase-lock loops, may also be used to compensate for differences in signal propagation delays in other embodiment.

A variety of techniques may be used to generate the Sel<0:3> signals to provide indications of the locations of each die 12-18 with respect to the external electrical connectors of a device (e.g., to provide an indication of the position of a die within a stack). For example, an integrated circuit using the clock circuits 100, 200 or a clock circuit according to some other embodiment may include a programmable option, such as an array of antifuses, that may be programmed when a semiconductor device is packaged to designate the position of each of the die 12-18. Other techniques may be used to automatically generate the Sel<0:3> signals to indicate die position.

Figure 5:
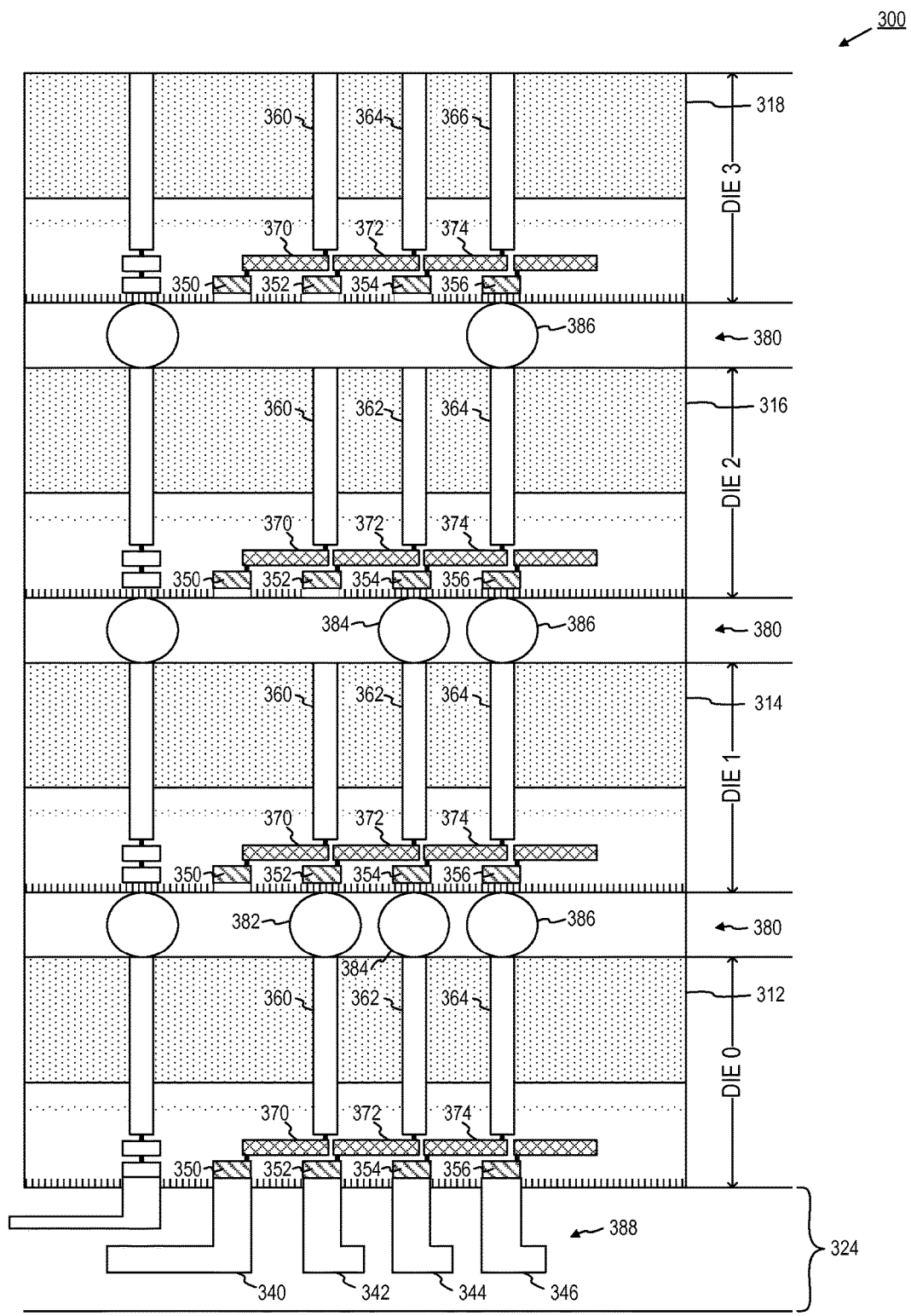
FIG. 5 is a schematic cross-sectional view of an embodiment configured to generate signals indicative of the position of a die in a stack.

For example, another technique that may be used to generate the Sel<0:3> signals is shown in FIG. 5. As shown in FIG. 5, a semiconductor device 300 may include 4 semiconductor die 312, 314, 316, and 318 that may each include a clock circuit, such as the clock circuit 100 shown in FIG. 1 or some other embodiment of a clock circuit. The die 312 may be mounted on a substrate 324 that includes a plurality of electrical contacts, such as contacts 338 (only 5 of which are shown in FIG. 5). Four of these contacts 338, i.e., 340, 342, 344, 346 may be coupled to respective contacts 350, 352, 354, 356 fabricated on one surface of the die 312. Each of the contacts 350-354 may be coupled to a respective tsv 360, 362, 364, which may be offset from the respective ones of the contacts 350-354 by respective laterally extending conductors 370, 372, 374. However, the contact 356 is not connected to any tsv.

Each of the die 314, 316, 318 may be identical to the die 312. Each of the die 314-318 may be coupled to an underlying die by a respective ball grid array. However, the number of balls 382-386 in each of the arrays 380 that are used to couple the contacts 350-356 to the tsv's 360-364 of the underlying die 312-316, respectively, may continuously decrease from the die 312 to the die 316. Thus, three balls 382-386 may be used to couple the tsv's 360-364 of the die 312 to the respective contacts 352-356 of the die 314, but only two balls 384, 386 may be used to couple the tsv's 362, 364 of the die 314 to the respective contacts 354, 356 of the die 316. Similarly, only one ball 386 may be used to couple the tsv 364 of the die 316 to the contact 356 of the die 318. As a result, all 4 contacts 350-356 of the die 312 are coupled to the contacts 340-346 of the substrate 324, only 3 contacts 352-356 of the die 314 are coupled to the contacts 342-346, only 2 contacts 354, 356 of the die 316 are coupled to the contacts 342-346, and only 1 contact 356 of the die 318 is coupled to the contacts 342-346. If the contacts 340-346 are biased to a first voltage, such as a supply voltage $V_{CC}$, to represent a logic "1," and a particular bias voltage, such as 0 volts, to represent a logic "0" is applied to each of the contacts 340-346 of the substrate 324, the 4 voltage levels present on each of the contacts 350-356 may be used to provide the 4 bits of the Sel<0:3> signal (FIGS. 3 and 4). In such case the Sel<0:3> signal for the die 312 will be "0000," the Sel<0:3> signal for the die 314 will be "1000," the Sel<0:3> signal for the die 316 will be "1100," and the Sel<0:3> signal for the die 318 will be "0111." Thus, the Sel<0:3> signal identifying the location of each die 312-318 in the stack may be automatically generated. However, other techniques may alternatively be used to generate the Sel<0:3> signal.

The embodiments described above compensate for variations in the signal propagation time between the substrate 24 and the die 12-18 resulting from differences in the locations of the die in a device, such as a stacked device 10, 52. However, variations other than signal propagation delay variations may exist for different die 12-18 in the stack. Therefore, viewed more broadly, embodiments may compensate for these other variations resulting from differences in the locations of the die 12-18. More specifically, in other embodiments a signal, such as the Sel<0:3> signal, may provide an indication of the location of a die in the stack. A compensation circuit, such as the clock circuits 100, 200, may receive the location indicating signal and may adjust a characteristic (e.g., of operation) of one or more circuits fabricated in the die to compensate for the location-induced variation. For example, the termination impedance of an externally accessible terminal of a die may vary with different locations of the die in a stack because of the conductor impedance may increase as signal paths extending between a die and a substrate become longer for die that are farther from the substrate. Similarly, the "drive strength", slew rate of an output driver, such as a data output buffer, may decrease for a die that is farther from the substrate because of the greater conductor length. Various embodiments may be used to compensate for these termination impedance and/or drive strength variations.

Figure 6:
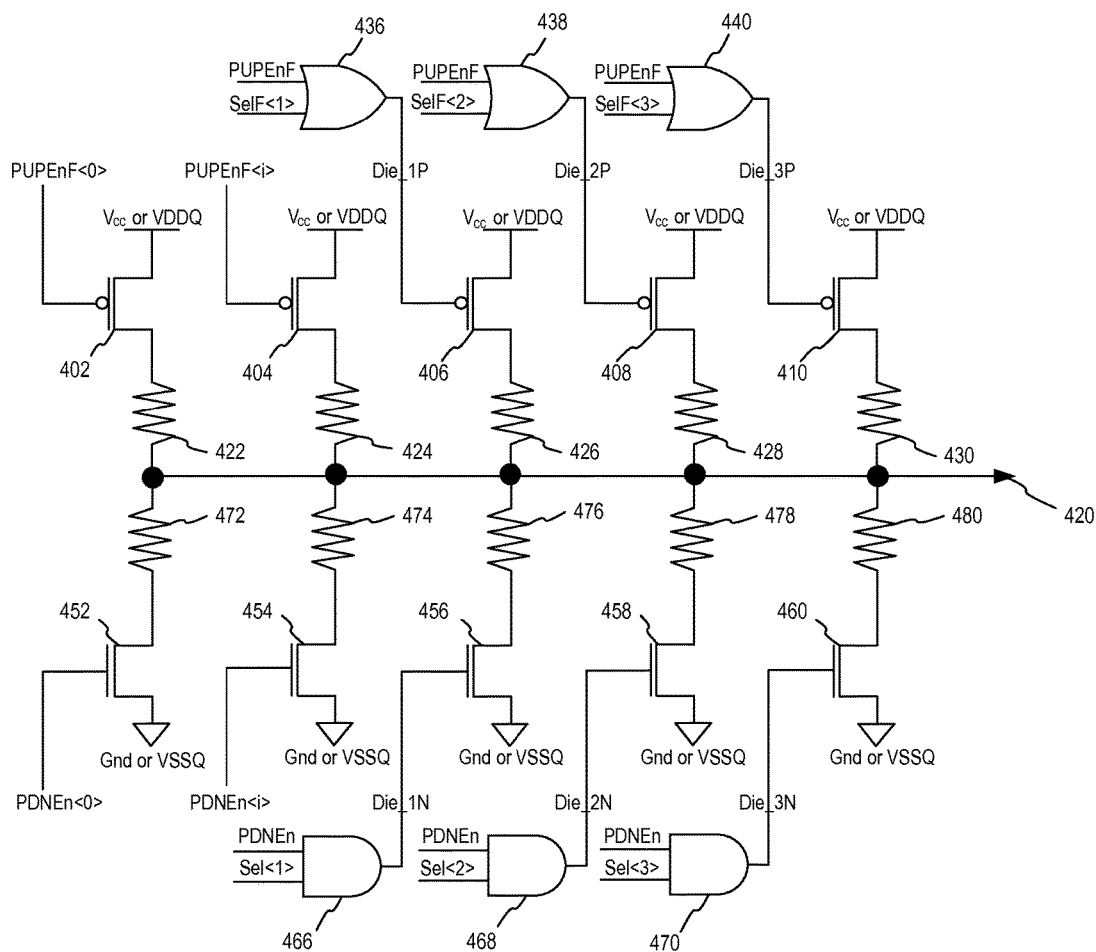
FIG. 6 is a schematic diagram showing an embodiment of a compensation circuit that may be used to compensate for drive strength and termination impedance variations resulting from difference in the location of stacked semiconductor die.

One embodiment of a compensation circuit 400 that may compensate for both termination impedance and drive strength variations resulting from differences in die location is shown in FIG. 6. The circuit 400 may include a plurality of PMOS pull-up transistors 402-410, which may have their respective sources coupled to a first voltage, such as a supply voltage $V_{CC}$ or VDDQ. The drains of the transistors 402-410 may be coupled to an output terminal 420 through respective resistances 422-430. All or some of the resistances 422-430 may have the same resistance value, although they may also all be different from each other. The gates of the transistors 402, 404 may be coupled to receive respective active-low pull-up signals PUPEnF<0:1> while the gates of the other transistors 406, 408, 410 may be coupled to an output of respective OR-gates 436, 438, 440. The OR-gates 436, 438, 440 may each have a first input that receives an active-low pull-up signal PUPEnF and a second input that receives a respective active-low select signal SelF<1:3>.

In a similar manner, a plurality of NMOS pull-down transistors 452-460 may have their respective sources coupled to a second voltage, such as ground. The drains of the transistors 452-460 may also be coupled to the output terminal 420 through respective resistances 472-480, such as discrete resistors. Again, all or some of the resistances 472-480 may have the same or different resistance values. The gates of the transistors 452, 454 may be coupled to receive respective active-high pull-down signals PDNEn<0:1> while the gates of the other transistors 456, 458, 460 may be coupled to an output of respective AND-gates 466, 468, 470. As with the OR-gates 436, 438, 440, each of the AND-gates 466, 468, 470 may have a first input that may receive an active-high pull-down signal PDNEn and a second input that may receive a respective active-high select signal Sel<1:3>.

In operation, one or more of the pull-up signals PUPEnF<0:1>, PUPENF signals may be driven low by suitable means such as by a memory device to drive the output terminal 420 high. Alternatively, one or more of the pull-down signals PDNEn<0:1>, PDNEN signals may be driven high by suitable means to drive the output terminal 420 low. The number of transistors 404-410 or 452-460 that are turned ON by the pull-up signals or pull-down signals, respectively, determine both the termination impedance and the drive strength of the transistors. If the compensation circuit 400 is on the die closest to the substrate, i.e., die #0, one or both of the pull-up signals PUPEnF<0:1> may be driven low to drive the output terminal 420 high, and one or both of the pull-down signals PDNEn<0:1> may be driven high to drive the output terminal 420 low. Either the PUPEnF signal or the PDNEn signal may also be driven low or high, respectively, but the SefF<1:3> signals may be inactive high and the Sef<1:3> signals are inactive low so that the respective transistors 406-410 or 456-460 are not turned ON. One the other hand, if the compensation circuit 400 is on die #1, the SefF<1> signal may be low to enable the OR-gate 436 and the Sef<1> signal may be high to enable the AND-gate 466 so that 3 transistors 402-406 are turned ON to drive the output terminal 420 high or 3 transistors 455-456 are turned ON to drive the output terminal 420 low. Similarly, if the compensation circuit 400 is on die #2, the SefF<2> signal may also be driven low (along with the SefF<1> signal) to enable the OR-gates 436, 438, and the Sef<1> and Sef<2> signal may also be driven high to enable the AND-gates 466, 468. As a result, 4 transistors 402-408 may be turned ON to drive the output terminal 420 high or 4 transistors 452-458 may be turned ON to drive the output terminal 420 low. Finally, if the compensation circuit 400 is on die #3, the SefF<3> signal may also be low and the Sef<3> signal may also be high so that all 5 transistors 402-410 are turned ON to drive the output terminal 420 high or all 5 transistors 452-460 are turned ON to drive the output terminal 420 low. In this manner, die farther away from the substrate may be provided with a greater drive strength and an reduced termination impedance.

Figure 7:
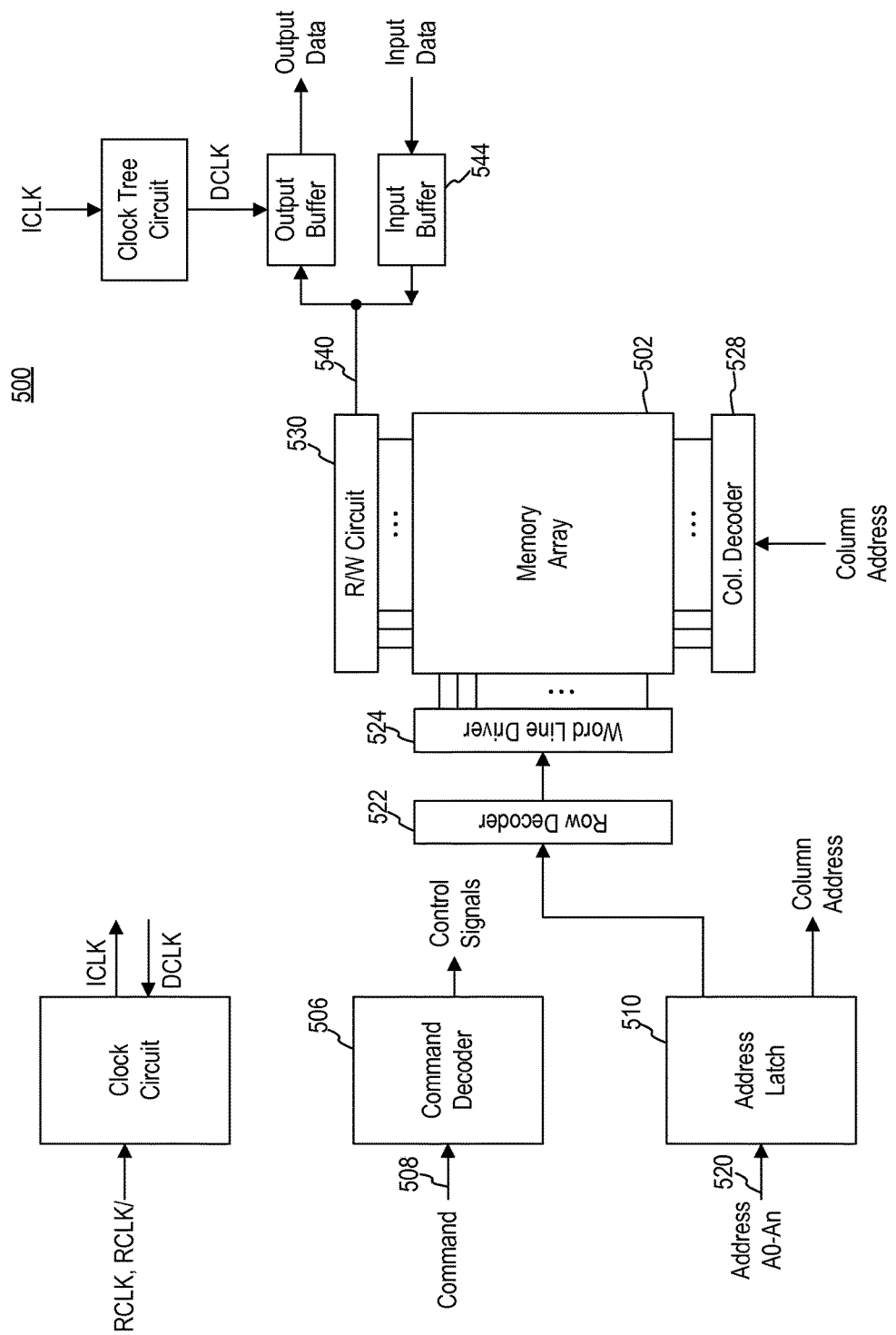
FIG. 7 is a block diagram of an embodiment of a memory die including an embodiment of a clock circuit.

The compensation circuits according to various embodiments may be used in connection with a wide variety of semiconductor devices. For example, FIG. 7 illustrates an embodiment of a portion of a memory die 500. An embodiment of a clock circuit 550 may be included in the memory die 500. As with the clock circuits 100, 200, the timing of an internal clock signal ICLK generated by the clock circuit 550 may be adjusted as a function of the location of the die 500 in a device, such as a stacked device. The memory die 500 may include an array 502 of memory cells, which may be, for example, DRAM memory cells, SRAM memory cells, flash memory cells, or some other types of memory cells. The memory die 500 may include a command decoder 506 that may receive memory commands through a command bus 508 and may generate corresponding control signals within the memory die 500 to carry out various memory operations. Row and column address signals may be applied to the memory device 500 through an address bus 520 and provided to an address latch 510. The address latch may then output a separate column address and a separate row address.

The row and column addresses may be provided by the address latch 510 to a row address decoder 522 and a column address decoder 528, respectively. The column address decoder 528 may select bit lines extending through the array 502 corresponding to respective column addresses. The row address decoder 522 may be connected to word line driver 524 that may activate respective rows of memory cells in the array 502 corresponding to received row addresses. The selected data line (e.g., a bit line or bit lines) corresponding to a received column address may be coupled to read/write circuitry 530 to provide read data to a data output buffer 534 via an input-output data bus 540. The clock circuit 550 may provide an ICLK signal to the clock tree circuit 140. In response to the ICLK signal, the clock tree circuit 140 may provide a DCLK signal for timing, for example, to clock the output buffer 534. Although not specifically shown in FIG. 7, the DCLK signal output by the clock tree circuit 140 can be used for timing different components as well. Write data may be applied to the memory array 502 through a data input buffer 544 and the memory array read/write circuitry 530. The command decoder 506 may respond to memory commands applied to the command bus 508 to perform various operations on the memory array 502. In particular, the command decoder 506 may be used to generate internal control signals to read data from and write data to the memory array 502. Circuits that compensate for other location-induced variations in a characteristic (e.g., of performance) of the memory die 500, such as its termination impedance and/or drive strength, may also be used in the memory die 500. For example, such circuit may providing an indication of the location of each of a plurality of semiconductor die. In response to the indication, a characteristic of a circuit of the die may be adjusted to compensate for a location-induced variation. Although specific embodiments have been disclosed, persons skilled in the art will recognize that changes may be made in form and detail without departing from the invention. Such modifications are well within the skill of those ordinarily skilled in the art. Accordingly, the invention is not limited except as by the appended claims.

What is claimed is:

1. An apparatus comprising:
a plurality of semiconductor dice, wherein each semiconductor die of the plurality of semiconductor dice comprises a circuit and is configured to adjust a characteristic of the circuit in response to a respective select signal programmed to indicate a defined position of each semiconductor die relative other ones of the plurality of semiconductor dice in the apparatus.

2. The apparatus as claimed in claim 1, wherein the plurality of semiconductor dice are stacked to form a stacked device and the respective select signal indicates a stack position of the semiconductor die of the plurality of semiconductor dice.

3. The apparatus as claimed in claim 1, wherein each semiconductor die of the plurality of semiconductor dice is configured to externally receive the respective select signal.

4. The apparatus as claimed in claim 1, further comprising:
antifuses configured to provide the programmable select signal.

5. The apparatus as claimed in claim 1, wherein the circuit includes a delay circuit and the characteristic of the circuit includes an amount of a delay time of the delay circuit.

6. The apparatus as claimed in claim 1, wherein the circuit includes a synchronization circuit that includes a model delay in a feedback path thereof and the characteristic of the circuit includes an amount of a delay time of the model delay.

7. The apparatus as claimed in claim 6, wherein the synchronization circuit includes a delay locked loop circuit.

8. The apparatus as claimed in claim 1, wherein the circuit includes an output driver and the characteristic of the circuit includes a termination impedance of the output driver.

9. The apparatus as claimed in claim 1, wherein the circuit includes an output driver and the characteristic of the circuit includes a drive strength of the output driver.

10. An apparatus comprising:
first and second semiconductor dice stacked to form a stacked device, the first semiconductor die comprising a first circuit that is configured to perform a first function, the first semiconductor die being configured to adjust a characteristic of the first circuit to a first value based on a select signal programmed to indicate a first defined stack position of the first semiconductor die in the stacked device having a first programmed value, the second semiconductor die comprising a second circuit that is configured to perform the first function, the second semiconductor die being configured to adjust a characteristic of the second circuit to a second value different from the first value based on the select signal programmed to indicate a second defined stack position of the second semiconductor die in the stacked device having a second programmed value.

11. The apparatus as claimed in claim 10, wherein each of the first circuit and the second circuit includes a delay circuit and the characteristic of each of the first circuit and the second circuit includes an amount of a delay time of the delay circuit.

12. The apparatus as claimed in claim 10, wherein each of the first circuit and the second circuit includes a synchronization circuit that includes a model delay in a feedback path of the synchronization circuit and the characteristic of each of the first circuit and the second circuit includes an amount of a delay time of the model delay.

13. The apparatus as claimed in claim 12, wherein the synchronization circuit includes a delay locked loop circuit.

14. The apparatus as claimed in claim 10, wherein each of the first circuit and the second circuit includes an output driver and the characteristic of each of the first circuit and the second circuit includes a termination impedance of the output driver.

15. The apparatus as claimed in claim 10, wherein each of the first circuit and the second circuit includes an output driver and the characteristic of each of the first circuit and the second circuit includes a drive strength of the output driver.

16. An apparatus comprising:
   a first semiconductor die configured to be identified by a first select signal programmed to indicate a first defined position, the first semiconductor die comprising a first circuit that is configured to perform a first function, the first semiconductor die being further configured to adjust a characteristic of the first circuit in response to the first select signal; and
   a second semiconductor die stacked with the first semiconductor die, the second semiconductor die being configured to be identified by a second select signal programmed to indicate a second defined position different from the first defined position, the second semiconductor die comprising a second circuit that is configured to perform the first function, the second semiconductor die further configured to adjust a characteristic of the second circuit in response to the second select signal.

17. The apparatus as claimed in claim 16, wherein the first semiconductor die is further configured to externally receive the first select signal and the second semiconductor die is further configured to externally receive the second select signal.

18. The apparatus as claimed in claim 16, further comprising:
   antifuses configured to provide the first and second select signals.

* * * * *